(12) United States Patent
Liu et al.

(10) Patent No.: US 9,146,469 B2
(45) Date of Patent: Sep. 29, 2015

(54) MIDDLE LAYER COMPOSITION FOR TRILAYER PATTERNING STACK

(71) Applicant: TAIWAN SEMICONDUCTOR MANUFACTURING COMPANY, LTD., Hsin-Chu (TW)

(72) Inventors: Chen-Yu Liu, Kaohsiung (TW); Ching-Yu Chang, Yuansun Village (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/014,185

(22) Filed: Aug. 29, 2013

(65) Prior Publication Data

US 2014/0272709 A1    Sep. 18, 2014

Related U.S. Application Data

(60) Provisional application No. 61/782,909, filed on Mar. 14, 2013.

(51) Int. Cl.
G03F 7/09 (2006.01)
G03F 7/20 (2006.01)

(52) U.S. Cl.
CPC . *G03F 7/092* (2013.01); *G03F 7/20* (2013.01)

(58) Field of Classification Search
CPC .................................. G03F 7/004; G03F 7/092
See application file for complete search history.

(56) References Cited

U.S. PATENT DOCUMENTS

| | | | |
|---|---|---|---|
| 6,183,872 B1 | 2/2001 | Tanaka et al. | |
| 6,420,085 B1 | 7/2002 | Nishi et al. | |
| 6,548,221 B2 | 4/2003 | Uetani et al. | |
| 6,902,862 B2 | 6/2005 | Takahashi et al. | |
| 7,285,369 B2 | 10/2007 | Takahashi | |
| 7,629,108 B2 | 12/2009 | Watanabe et al. | |
| 7,651,831 B2 | 1/2010 | Li et al. | |
| 7,670,751 B2 | 3/2010 | Ohashi et al. | |
| 7,972,763 B2 | 7/2011 | Suetsugu et al. | |
| 7,985,534 B2 | 7/2011 | Tsubaki | |
| 8,017,304 B2 | 9/2011 | Tarutani et al. | |
| 8,080,361 B2 | 12/2011 | Takahashi et al. | |
| 8,383,318 B2 | 2/2013 | Meador et al. | |
| 8,394,570 B2 | 3/2013 | Ohashi et al. | |
| 8,420,304 B2 | 4/2013 | Inatomi et al. | |
| 8,609,889 B2 | 12/2013 | Ohashi et al. | |
| 8,642,253 B2 | 2/2014 | Tsubaki et al. | |
| 8,741,554 B2 | 6/2014 | Hatakeyama et al. | |
| 8,753,797 B2 | 6/2014 | Lin et al. | |
| 8,883,407 B2 | 11/2014 | Amara et al. | |
| 2005/0069819 A1 | 3/2005 | Shiobara | |
| 2005/0112497 A1* | 5/2005 | Jung | 430/270.1 |
| 2007/0059849 A1 | 3/2007 | Op de Beeck | |
| 2007/0092843 A1 | 4/2007 | Yang et al. | |
| 2009/0098490 A1 | 4/2009 | Pham et al. | |
| 2009/0133908 A1 | 5/2009 | Goodner et al. | |
| 2010/0167178 A1 | 7/2010 | Yamato et al. | |
| 2011/0070542 A1 | 3/2011 | Wang et al. | |
| 2011/0086311 A1* | 4/2011 | Katayama et al. | 430/280.1 |
| 2013/0260311 A1 | 10/2013 | Ching-Yu Chang | |
| 2013/0323641 A1 | 12/2013 | Ching-Yu Chang et al. | |

FOREIGN PATENT DOCUMENTS

| | | |
|---|---|---|
| JP | 09-054440 | 2/1997 |
| JP | 2001-147523 | 5/2001 |
| JP | 2002-139838 | 5/2002 |
| JP | 2006-251672 | 9/2006 |
| WO | WO-2011-111805 | 9/2011 |

OTHER PUBLICATIONS

J.E. Hanson, K.H. Jensen, N. Gargiulo, D. Motta, D.A. Pingor, Anthony E. Novembre, David A. Mixon, J.M. Kometani and C. Knurek; "Photoacid and Photobase Generators: Arylmethyl Sulfones and Benzhydrylammonian Salts;" May 5, 1995; pp. 137-148; Chapter 9; American Cancer Society; http://pubs.acs.org.

Kanji Suyama and Masamitsu Shirai; "Photobase Generators: Recent Progress and Application Trend in Polymer Systems;" 2008; pp. 194-209; Progress in Polymer Science 34; www.elsevier.com/locate/ppolysci.

Fang Lin and Ching-Yu Chang; Surface-Modified Middle Layers; U.S. Appl. No. 13/543,582; filed Jul. 6, 2012;.

Hiroto Yukawa; "TOK Resist Development Status for EUVL;" May 23, 2006; pp. 1-11; C/N: 1220605080; TOK Litho Forum; Tokyo Ohka Kogyo CO., Ltd.; Advanced Material Development Division 1; Vancouver, Canada.

KR Application No. 1020120101654, Korean Final Rejection Mailed Dec. 23, 2014, 6 Pages.

* cited by examiner

*Primary Examiner* — Kathleen Duda
(74) *Attorney, Agent, or Firm* — Haynes and Boone, LLP

(57) ABSTRACT

Methods and materials for making a semiconductor device are described. The method includes forming a middle layer (ML) of a patterning stack (e.g., a tri-layer patterning stack such as a tri-layer resist) and forming a photoresist layer directly on the middle layer. The middle layer includes an additive component having a photo base generator (PBG). The substrate including the photoresist layer and the middle layer is then exposed to a radiation. A covalent bond between the ML and the photoresist layer may be formed.

7 Claims, 10 Drawing Sheets

MIDDLE LAYER COMPOSITION FOR TRILAYER PATTERNING STACK

CROSS-REFERENCE

This application claims priority to U.S. Provisional Patent Application Ser. No. 61/782,909, filed on Mar. 14, 2013, and entitled "Middle Layer Composition For Trilayer Patterning Stack," the entire disclosure of which is hereby incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased. As lithographic features are reduced, for example, to below 40 nanometers (nm), high numerical aperture processes are needed to overcome the resolution limit. The use of a trilayer photoresist films scheme appears to be promising in this regard. Specifically trilayer photoresist films can provide for improvements in line edge roughness (LER) and line width roughness (LWR) among other benefits.

Using trilayer schemes however raises challenges, especially with the decreasing technology nodes and pitch provided between features. The decreasing feature size and pitch can lead to collapse of photoresist features. This can collapse or pattern peeling may be due to the deterioration of adhesion between the top photoresist layer and the middle layer of the trilayer scheme. Thus, a process and material that reduces, minimizes or removes problems with a patterning material is desired.

BRIEF DESCRIPTION OF THE DRAWINGS

Aspects of the present disclosure are best understood from the following detailed description when read in association with the accompanying figures. It is noted that, in accordance with the standard practice in the industry, various features in the drawings are not drawn to scale. In fact, the dimensions of illustrated features may be arbitrarily increased or decreased for clarity of discussion.

DETAILED DESCRIPTION

Figure 1:
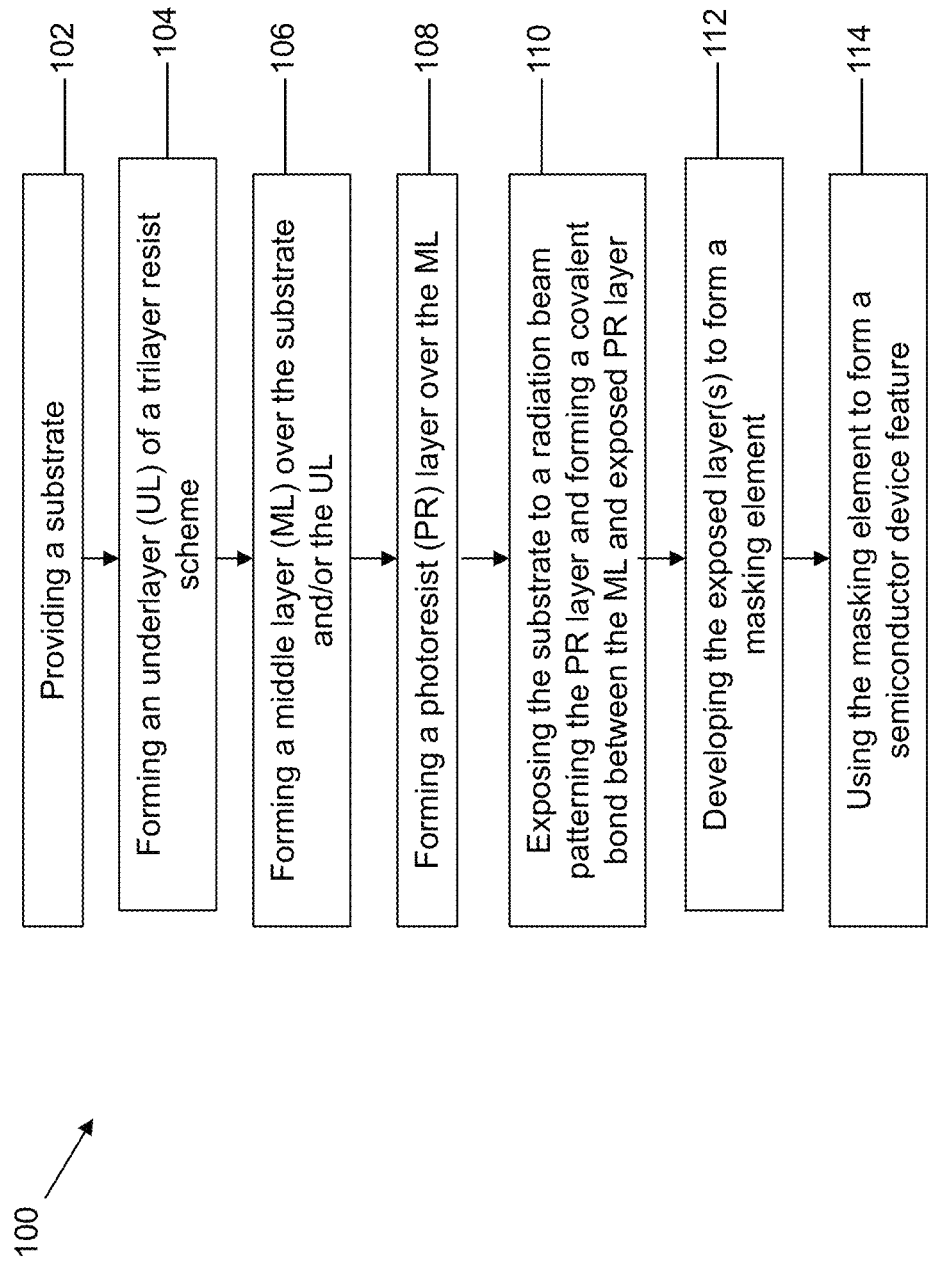
FIG. 1 is a flowchart of an embodiment of a method for making a semiconductor device according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flowchart of one embodiment of a method 100 of making a semiconductor device according to aspects of the present disclosure. FIGS. 2-5 are cross-sectional views of a semiconductor device 200 fabricated according to one or more steps of the method 100. It is understood that the method 100 includes steps having features of a complementary metal-oxide-semiconductor (CMOS) technology process flow and thus, are only described briefly herein. Additional steps may be performed before, after, and/or during the method 100.

It is also understood that parts of the semiconductor device 200 may be fabricated by complementary metal-oxide-semiconductor (CMOS) technology process flow, and thus some processes are only briefly described herein. Further, the semiconductor device 200 may include various other devices and features, such as additional transistors, bipolar junction transistors, resistors, capacitors, diodes, fuses, etc., but is simplified for a better understanding of the inventive concepts of the present disclosure.

The device 200 may be an intermediate device fabricated during processing of an integrated circuit, or portion thereof, that may comprise static random access memory (SRAM) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof. The semiconductor device 200 includes a plurality of semiconductor devices (e.g., transistors), which may be interconnected.

The method 100 begins at step 102 by providing a substrate. The substrate may be a semiconductor substrate, such as a semiconductor wafer. The substrate may include silicon in a crystalline structure. In alternative embodiments, the substrate may include germanium, silicon germanium, silicon carbide, gallium arsenide, indium arsenide, indium phosphide, and/or other suitable materials. The substrate may be a silicon-on-insulator (SOI) substrate. The substrate may include a plurality of layers and/or features formed on the semiconductor substrate including doped regions or wells, isolation regions such as shallow trench isolation (STI) features, conductive layers, insulating layers, and various other suitable features. For example, the substrate may include one or more target layers, which are desired to patterned. Referring to the example of FIG. 2, a substrate 202 is illustrated. In embodiments, the substrate 202 has any plurality of layers (conductive layer, insulator layer) or features (source/drain regions, gate structures, interconnect lines and vias), formed thereon. The substrate 202 may include one or more target layers disposed on a semiconductor substrate; the target layers suitable for patterning by the method 100. Exemplary target layers include gate layers, interconnect layers, and/or other suitable layers. In an embodiment, the patterning by the method 100 may be suitable to etch portions of the semiconductor substrate itself (e.g., such as in the formation of fins for a fin-type field effect transistor).

The method 100 then proceeds to block 104 where an underlayer (UL) of a trilayer patterning stack is formed on the substrate. The underlayer may be a first (e.g., nearest the substrate) layer of a trilayer patterning stack also referred to as a tri-layer resist. In an embodiment, the underlayer is organic. In a further embodiment, the organic material includes a plurality of monomers or polymers that are not cross-linked. Generally, the underlayer layer may contain a material that is patternable and/or have a composition tuned to provide anti-reflection properties. Exemplary materials for the underlayer include a carbon backbone polymer. In an embodiment, the underlayer is omitted. In some embodiments, the underlayer may be formed by a spin coating process. In other embodiments, the underlayer may be formed by another suitable deposition process.

Figure 3:
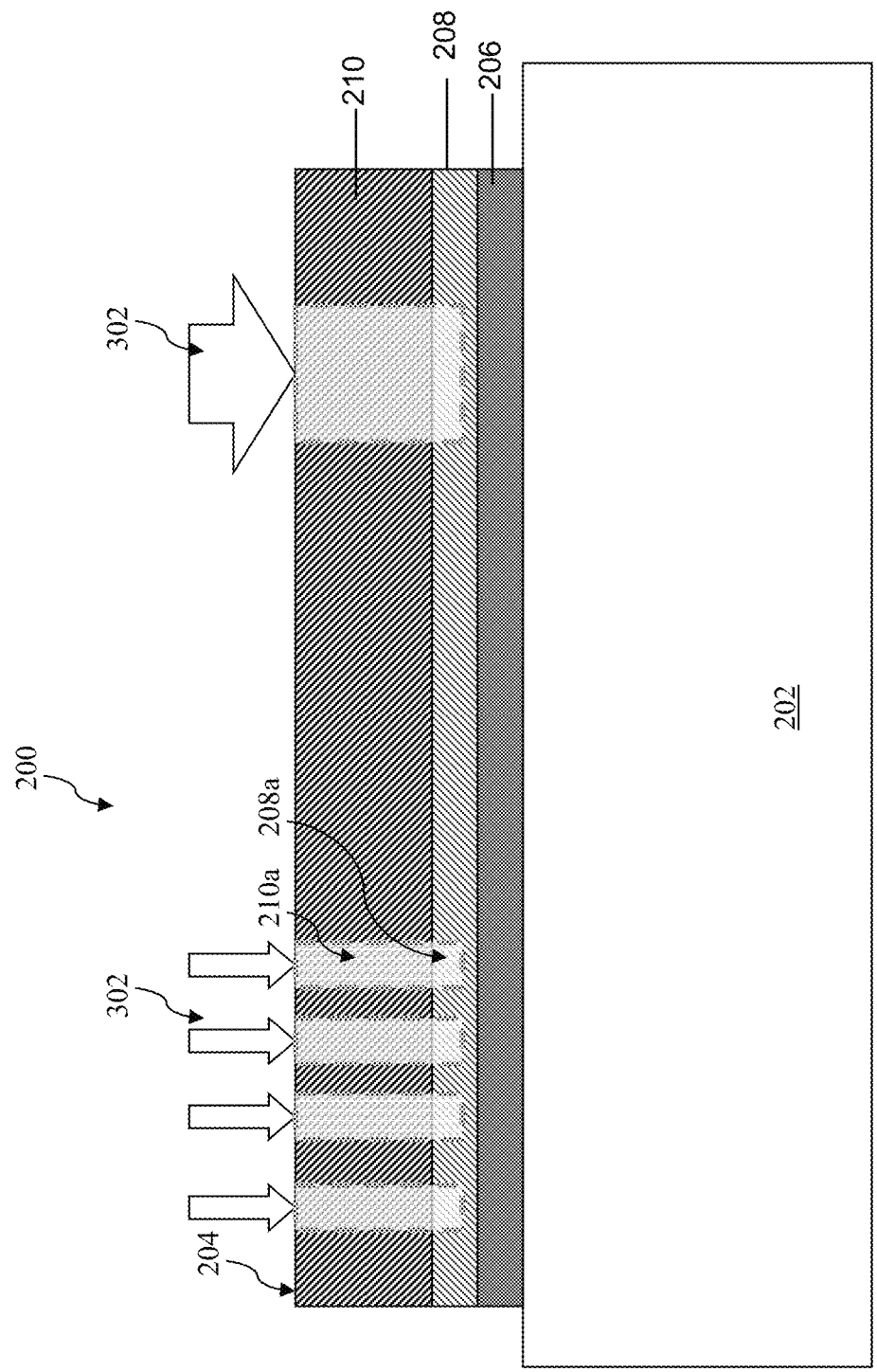

Referring now to FIG. 3, a trilayer patterning stack 204 is disposed on the substrate 202. The trilayer patterning stack 204 includes underlayer 206. In an embodiment, the underlayer 206 is a carbon backbone polymer.

The method 100 then proceeds to block 106 where a middle layer (ML) over the substrate and/or the UL. The middle layer may be a second layer of a trilayer patterning stack. Generally, the middle layer may have a composition that provides an anti-reflective properties and/or hard mask properties for the lithography process. In an embodiment, the middle layer includes a silicon containing layer (e.g., silicon hard mask material). The middle layer may include a silicon-containing inorganic polymer. In a further embodiment, the middle layer includes a siloxane polymer (e.g., a polymer having a backbone of O—Si—O—Si— etc.). The silicon ratio of the middle layer material may be controlled such as to control the etch rate. In other embodiments the middle layer may include silicon oxide (e.g., spin-on glass (SOG)), silicon nitride, silicon oxynitride, polycrystalline silicon, a metal-containing organic polymer material that contains metal such as titanium, titanium nitride, aluminum, and/or tantalum; and/or other suitable materials. The middle layer may be thermally baked for cross-linking, thus without further requiring a solvent. In some embodiments, the middle layer does include a solvent. For any or all of these compositions of the middle layer, an additive may be added (mixed or blended therewith) to enhance the middle layer. This additive is discussed further below.

In embodiments previously presented, the middle layer may include additives that float to the surface to affect the contact angle and other properties of the middle layer's interface with an overlying photoresist layer (such as discussed below with reference to step 108). Some of these additives are described in detail in Ser. No. 13/543,582 with a filing date of Jul. 6, 2012, which is hereby incorporated by reference in its entirety. The methods and compositions discussed in this application (Ser. No. 13/543,582) may provide for enhancements in the interface between layers such as provided by hydrophilic-to-hydrophilic forces or hydrogen bonding. However, in some embodiments, further adhesion between the middle layer and a surrounding layer may be desired. Thus, the middle layer of the present method 100 may include a composition such that a relatively stronger bond—a covalent bond—is formed between the middle layer and an abutting layer such as, for example, an overlying photoresist.

Thus, the middle layer may include a composition that allows for a covalent bond is formed between the middle layer and the overlying photoresist after an exposure process and/or subsequent baking process. In an embodiment, the middle layer includes an additive compound or component having a photo base generator (PBG). This PBG generates a base that interacts with the exposed photoresist and provides for covalent bonding between the middle layer and a component of the overlying photoresist.

In an embodiment, middle layer is a siloxane polymer and the additive component is combined (blended or mixed) with this polymer. In a further embodiment, the additive component is provided at approximately 10% as compared to an approximately 90% of the base polymer (e.g., siloxane). It should be noted that while embodiments are discussed herein that provide a PBG as linked to an additive component separate from and mixed/blended with the middle layer material such as siloxame polymer, this configuration is not so limited. Specifically, a PBG may be attached to the middle layer component itself (for example, to the siloxane polymer) or portions of such components.

Thus, the middle layer includes one or more components having a PBG group attached thereto. Exemplary photo-base generators that may be included are components that generate amines and sulfur (sulfur ions S—) bases. Other compositions of PBG include carbamates, O-acyloximes, ammonium salts, amineimides, α-aminoketones, some amidine precursors, aromatic ureas, trimethylbenzhydrylammonium iodide, and/or other suitable PBG compositions now known or later developed.

In an embodiment, the additive component to the middle layer composition is a polymer having the PBG attached thereto. Alternatively or additionally, the additive component may include cyclic ring, norbornane, benzene, adamantine, and/or other suitable structure having PBG(s) attached thereto. Exemplary additive components may include those components discussed in the application receiving Ser. No. 13/543,582, which is hereby incorporated by reference. Any or all of these additive compositions may be altered to include one or more PBG groups.

The additive (including the PBG component) may float to a top surface, or region adjacent the top surface, of the middle layer. The additive may float on account of molecular weight differences, surface energy differences, and/or other possible affects. Thus, the middle layer may stratified and provide a layer having a first or top region having a greater percentage of additive components than a second or lower region. For example, a top region may include approximately 10% additive component, while a bottom region may include less than approximately 1% additive component or substantially no additive component. This stratification of the middle layer is discussed in further detail below.

The middle layer may be formed by a spin-on coating process, chemical vapor deposition process (CVD), physical vapor deposition (PVD) process, and/or other suitable deposition processes.

Figure 2:
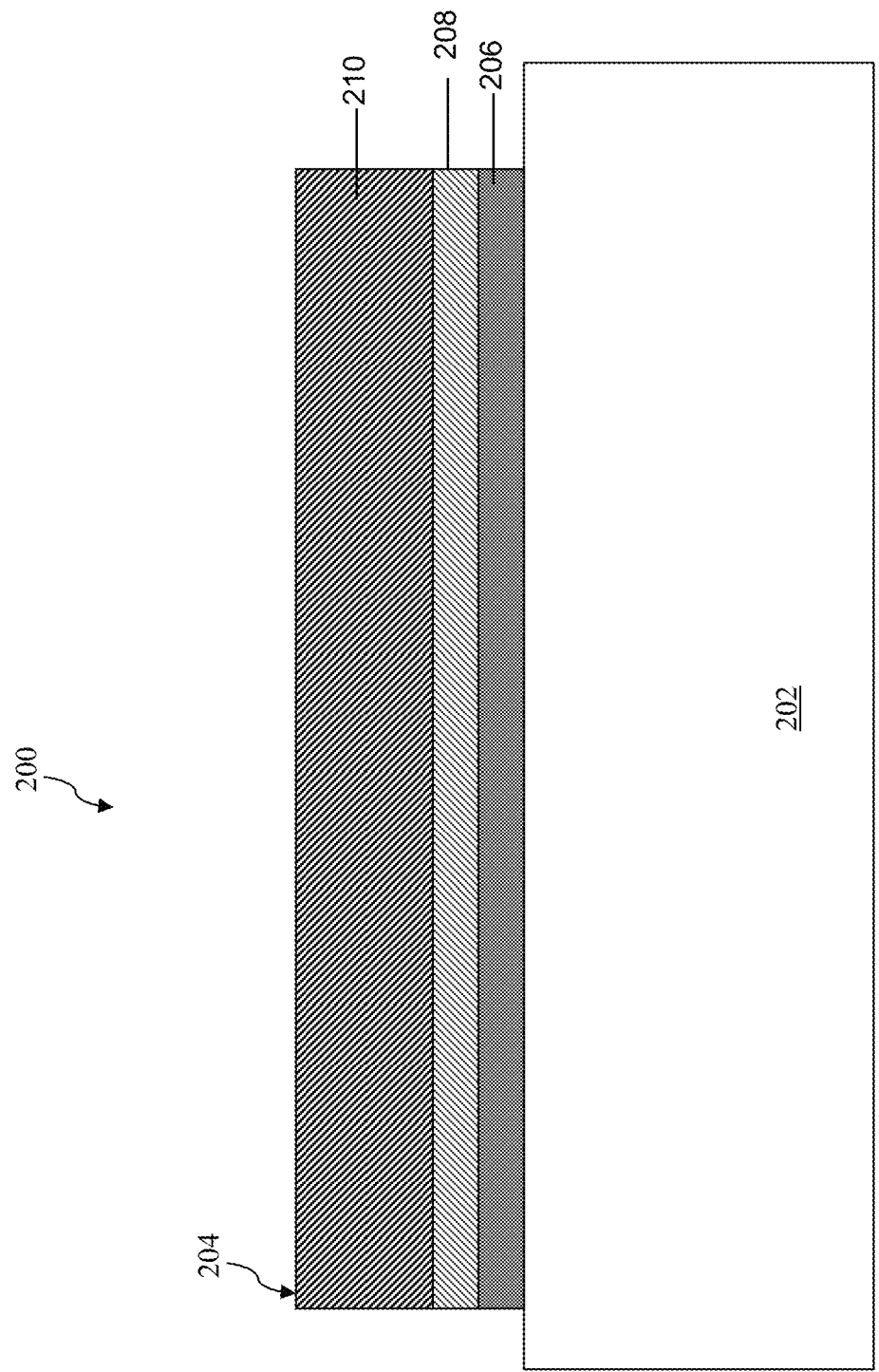
FIGS. 2-6 are diagrammatic fragmentary cross-sectional side views of an embodiment of a semiconductor device according to various aspects of the present disclosure.

Referring to the example of FIG. 2, a middle layer 208 is disposed on the UL 206 as one component of the trilayer patterning stack 204. The middle layer 208 may include a suitable material such as a hard mask material, having an additive component including a PBG group. For example, in an embodiment, the middle layer 208 includes a siloxane polymer blended or mixed with an additive component. The additive component may be a composition (e.g., polymer) including a plurality of photo-base generator groups (PBGs). The middle layer 208 is described in further detail with reference to FIGS. 6-11.

The method 100 then proceeds to block 108 where a photoresist (PR) layer is formed over the ML. The PR layer may be a third, and top, layer of a trilayer patterning stack. The PR layer may be a photosensitive layer operable to be patterned by a radiation as known in the art. Typically, the chemical properties of the photoresist regions struck by incident radiation change in a manner that depends on the type of photoresist used. In an embodiment, the PR layer is a suitable positive tone resist. Positive tone resist refers to a photoresist material that that when exposed to radiation (typically UV light) becomes insoluble to a negative tone developer, while the portion of the photoresist that is non-exposed (or exposed less) becomes soluble to the negative tone developer. The term "negative tone developer" may refer to any suitable developer that selectively dissolves and removes areas that received no exposure dose or an exposure dose below a predetermined threshold exposure dose value. The negative tone developer may include an organic solvent. The organic solvent can comprise a solvent such as, for example, a ketone-based solvent, ester-based solvent, alcohol-based solvent, amide-based solvent, ether-based solvent, hydrocarbon-based solvent, and/or other suitable solvent. As discussed below, the solubility provides for forming a patterned photoresist layer.

The PR layer may include a carbon backbone polymer. The PR layer may include other suitable components such as a solvent and/or photo acid generators. For example, in a further embodiment, the PR layer is a chemical amplified (CA) resist known in the art. In one embodiment, the photoresist layer includes a photo-acid generator (PAG) distributed in the photoresist layer. When absorbing photo energy from an exposure process, the PAG forms a small amount of acid. The resist may include a polymer material that varies its solubility to a developer when the polymer is reacted with this generated acid. The CA resist may be a positive tone resist. Examples of suitable PAGs include salts of sulfonium cations with sulfonates, salts of iodonium cations with sulfonates, sulfonyldiazomethane compounds, N-sulfonyloxyimide PAGs, benzoinsulfonate PAGs, pyrogallol trisulfonate PAGs, nitrobenzyl sulfonate PAGs, sulfone PAGs, glyoxime derivatives, triphenylsulfonium nonaflate, and/or other suitable PAGs now known or later developed. One or more of these PAGs may generate an acid that interacts with the base generated by the PBG of the middle layer after exposure and/or hard baking, as described herein.

In an embodiment, after deposition a soft bake process is performed on the PR layer. Referring to the example of FIG. 2, a photoresist (PR) layer 210 is disposed on the middle layer 208. The PR layer 210 may be a positive tone resist.

The method 100 then proceeds to block 110 where the substrate is exposed to a radiation beam thereby patterning the PR layer. The radiation beam may expose the resist deposited on the substrate using a lithography system that provides a pattern of the radiation according to an IC design layout. In one embodiment, a lithography system includes an ultraviolet (UV) radiation, a deep ultraviolet (DUV) radiation, an extreme ultraviolet (EUV) radiation, an X-ray radiation, and/or other suitable radiation types. In alternative embodiments, a lithography system includes a charged particle lithography system, such as an electron beam or an ion beam lithography system.

Referring to the example of FIG. 3, a patterned radiation beam 302 is incident the substrate 202 and specifically the PR layer 210. The regions 210a illustrate the portions of the resist that have been exposed to the radiation, and thus, a chemical change has occurred in those reasons. In the case of negative resist, the regions 210a are insoluble in developer. The radiation beam 302 may also incur a chemical change within the middle layer 208. For example, the PBG of the middle layer may generate a base upon exposure to the radiation.

The exposure process of block 110, including as illustrated by patterned radiation beam 302, may generate an acid in the PR (on account of the PAG) and generate a base in the middle layer (on account of the PBG) as described above. Upon exposure and generation of the respective acid and base, the generated base of the middle layer may quench the generated acid of the PR layer. Residual (e.g., excess) base may be present in the middle layer after the quenching.

In embodiments of the method 100, after the exposure process, a baking process may occur. The bake may be a hard bake. In an embodiment, the PR layer is a chemically amplified resist (CAR) and the bake process serves improve the insolubility. After or during this bake process, the residual base of the middle layer may react with a component of the PR layer to form a linkage or bond there between. In an embodiment, this linkage is a covalent bond. In one embodiment, the residual generated base reacts with an acid labile group (ALG) generated and/or provided in the PR layer. In a further embodiment, an acid labile group (ALG) is generated by the resist after exposure. Thus, in an embodiment, the residual base left in the middle layer after quenching the acid of the PR generated by the exposure, can react with the PR ALG to form a covalent bond linker. This may improve the adhesion between the PR layer and the middle layer in the exposed regions. Examples of this process are described in further detail below.

The method 100 then proceeds to block 112 where the exposed layer(s) are developed to form a masking element. A developer may be applied to the exposed resist to form a resist pattern on the substrate.

In an embodiment, a negative tone developer is applied in block 112. The term "negative tone developer" refers to a developer that selectively dissolves and removes areas that received no exposure dose (or an exposure dose below a predetermined threshold exposure dose value).

In an embodiment, a developer may include an organic solvent or a mixture of organic solvents, such as methyl a-amyl ketone (MAK) or a mixture involving the MAK. In another embodiment, a developer includes a water based developer, such as tetramethylammonium hydroxide (TMAH). Applying a developer includes spraying a developer on the exposed resist film, for example by a spin-on process. In an embodiment, the developer may remove the non-exposed regions of the resist leaving the portions have been exposed. It is noted that in an embodiment, the covalent bond between the PR layer and the middle layer is provided in only in this region having radiation incident thereto. This region may be the region of the photoresist layer (e.g., positive resist) that is insoluble to a developer such as a negative tone developer, discussed above.

Figure 4:
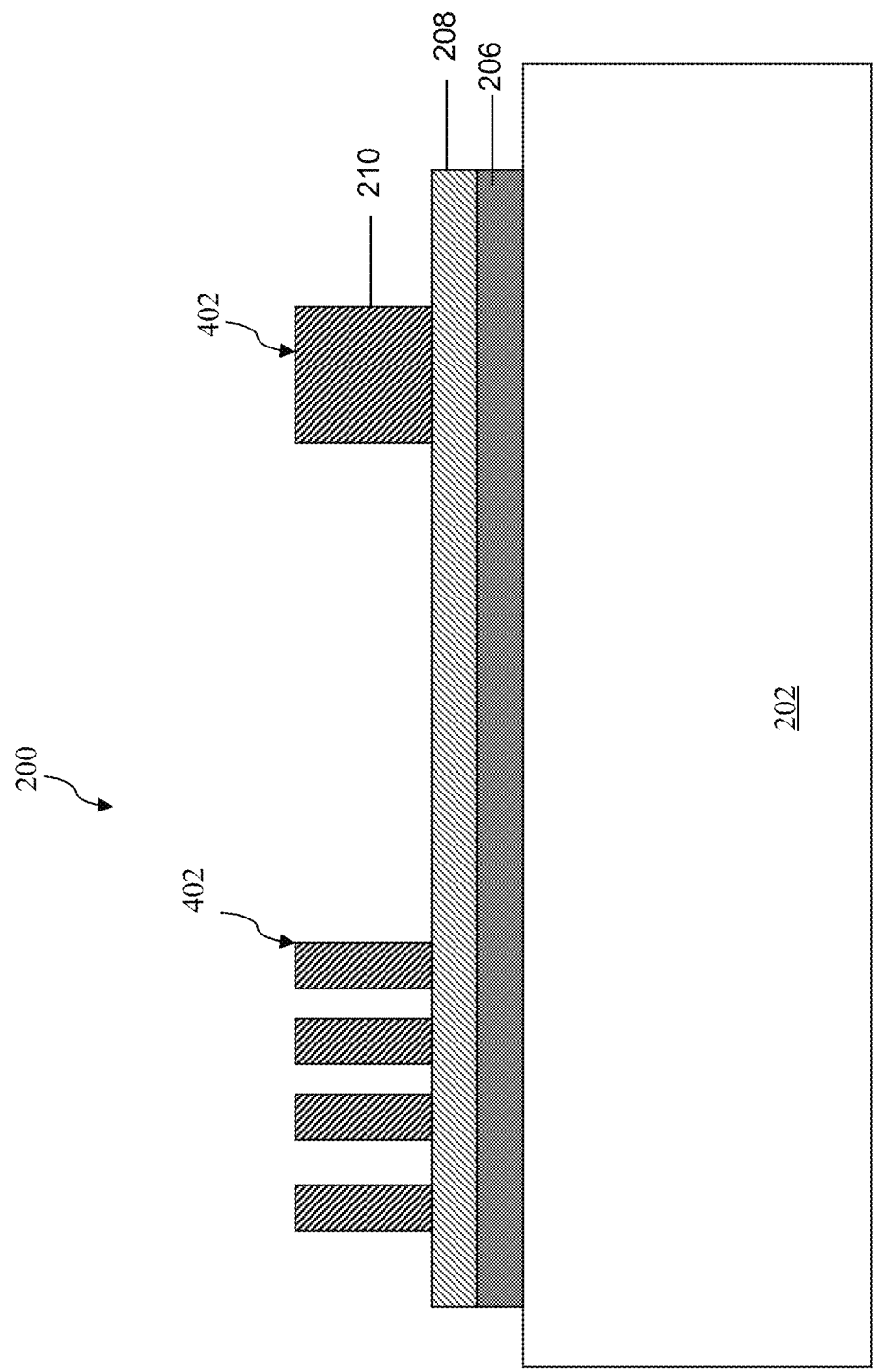
Figure 5:
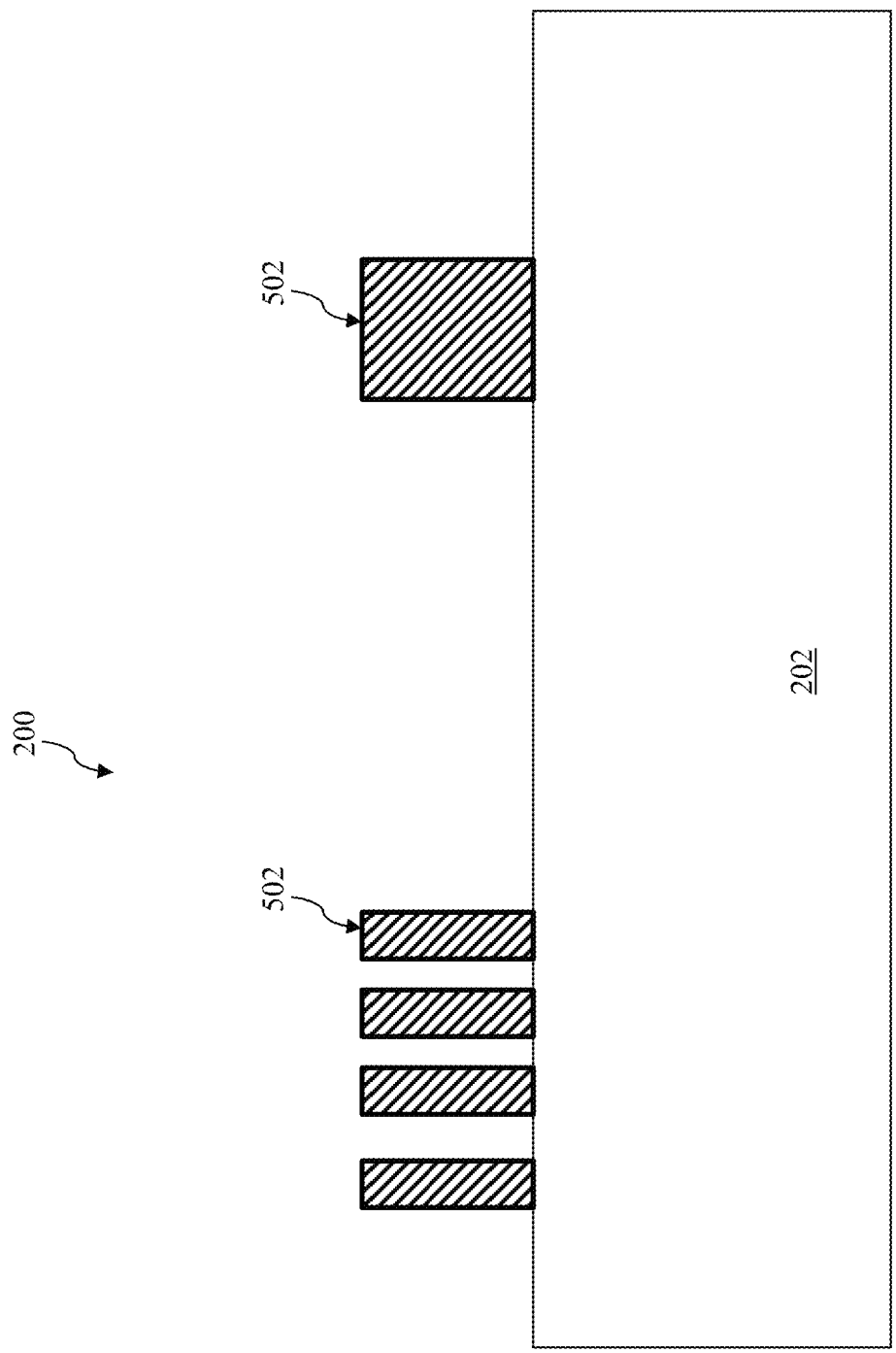

Referring to the example of FIG. 4, a masking element 402 is provided in the photoresist layer 210. The masking element 402 may be formed by applying a developer to the exposed photoresist layer 210. In an embodiment, the masking element 402 is used to etch the middle layer 208. In turn, the etched middle layer 208 may be used as a masking element to pattern additional layers. In other embodiments or further embodiments, one or more of the layers on the substrate 202 may also be patterned using subsequent etching processes such as dry etching or plasma etching based on the pattern provided by the masking elements 402. The masking element 402 may be insoluble to a negative tone developer.

The method 100 then proceeds to block 114 where a masking element is used to form a semiconductor device feature. In an embodiment, the masking element includes one or more of the photoresist layer, the middle layer, and the underlayer. In a further embodiment, the photoresist layer is stripped after transferring the pattern to the middle layer (by suitable etching process discussed above). The patterned middle layer may then be used as the masking element to pattern additional layer(s). Referring to the example of FIG. 5, features 502 are formed of a target layer of the substrate 202. The features 502 are defined by the masking element (see FIG. 4). Features 502 may be gate structures, fin structures such as provided in a fin-type field effect transistor, interconnect structures, isolation features, conductive features such as lines, and/or other suitable semiconductor device features.

The method 100 may continue with further steps not specifically described herein but understood by one of ordinary skill in the art. For example, the semiconductor device 200 may next be subjected to a rinsing process, such as a de-ionized (DI) water rinse. The rinsing process may remove residue particles.

Referring now to FIGS. 6-11, illustrated are cross-sectional views of an interface between the middle layer 208 and the overlying photoresist layer 210 of a trilayer patterning stack. The middle layer may be substantially similar to the middle layer discussed above with reference to block 106 of the method 100, and/or the middle layer 208 of the device 200, described above with reference to FIGS. 2-5. For example, the middle layer 208 may be a second layer of a trilayer patterning stack. The middle layer 208 may have a composition that provides a hard mask. In an embodiment, the middle layer 208 includes a silicon containing layer. In a further embodiment, the middle layer includes a siloxane polymer.

Figure 12:
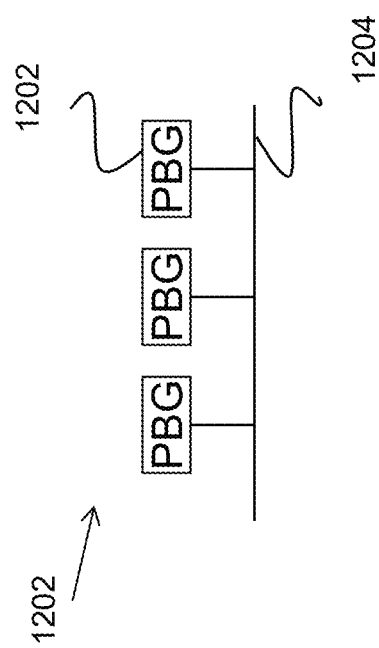
FIG. 12 illustrates an embodiment of an additive material having photo-base generator materials according to various aspects of the present disclosure.

The middle layer may include a composition that allows for a covalent bond is formed between the middle layer 208 and the overlying photoresist 210 after exposure. In an embodiment, the middle layer includes an additive compound or component having a photo base generator (PBG). In an embodiment, the additive component is combined with the hard mask polymer such as siloxane polymer. In a further embodiment, the additive component is provided at approximately 10% as compared to an approximately 90% of the base polymer (e.g., siloxane). FIG. 12 illustrates an additive component 1200. The additive component 1200 includes PBG groups 1202. The additive component 1200 may include a polymer backbone 1204. In an embodiment, the additive component 1200 includes a structure:

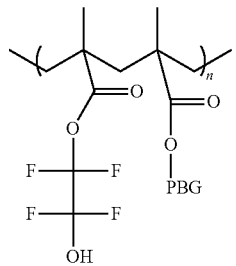

Thus, the middle layer includes a PBG. Exemplary PBGs include those producing a base of amines and sulfur-based bases (e.g., sulfur ions S—). Other compositions of PBGs include carbamates, O-acyloximes, ammonium salts, amine-imides, α-aminoketones, some amidine precursors, aromatic ureas, trimethylbenzhydrylammonium iodide, and/or other suitable PBG now known or later developed.

Figure 6:
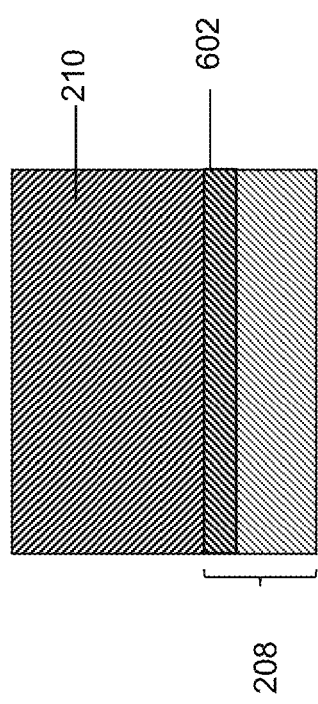

During or after application of the middle layer 208, the component including the PBG, such as the additive component including the PBG group(s), may float to a top surface or region adjacent the top surface of the middle layer. The additive may float on account of molecular weight differences, surface energy differences, and/or other possible affects. As illustrated in FIG. 6, the middle layer 208 is stratified. The middle layer 208 has a top region 602. The top region 602 includes the additive component. Thus, the region 602 includes PBG groups. In an embodiment, the top region 602 includes approximately 10% additive and approximately 90% hard mask polymer (e.g., silo xane).

Figure 7:
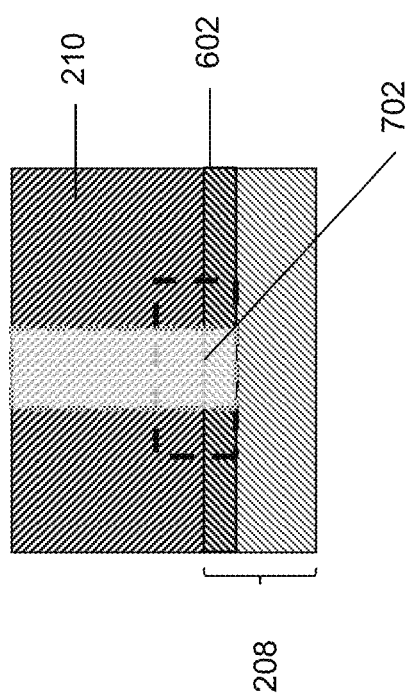
FIGS. 7-11 are detailed diagrammatic fragmentary cross-sectional views of an embodiment of a material stack including a photoresist and a middle layer fabricated according to one or more aspects of the present disclosure.

FIG. 7 illustrates the interface between the middle layer 208, specifically the upper region 602, and the photoresist layer 210 after exposure. The exposure process is described above with reference to block 110 of the method 100 of FIG. 1, and with respect to FIG. 3. After exposure, the PBG group of the middle layer region 602 generates a base component. Meanwhile, the PAG group of the photoresist layer 210 may generate an acid component. The base component may serve to quench the acid component. However, excess base component may be provided such that after the quenching residual base component in the middle layer remains.

The residual base component can react with the PR layer to provide a covalent bond with a component in the photoresist layer. In an embodiment, this reaction between the residual base component generated by the PBG of the middle layer and the PR layer component occurs upon baking as discussed above. In an embodiment, the covalent bonding, as it occurs on account of the exposure, is formed substantially or only in the region of exposure, denoted 702. The generated base component may be a base component such as amine, S$^-$, and/or other suitable base generated by PBG. FIGS. 8-11 illustrate the portion of FIG. 7 outlined in dashed lines in further detail.

Figure 8:
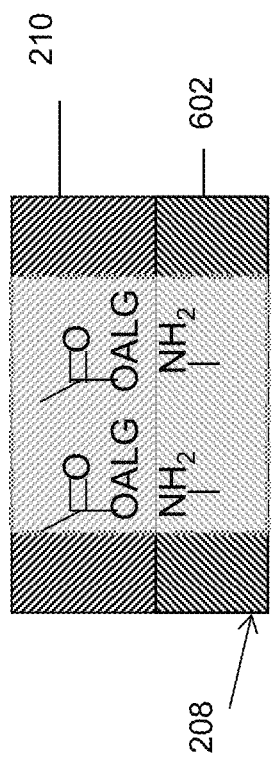
Figure 9:
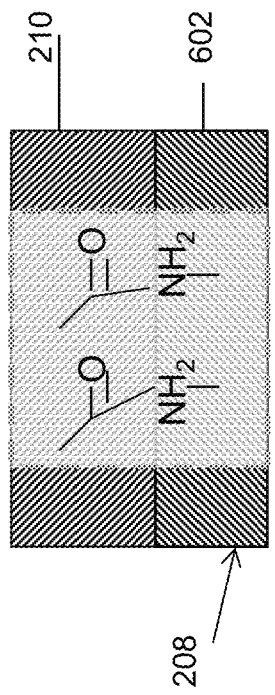

Referring to the example of FIG. 8, illustrated is the upper portion 602 of a middle layer 208. The upper portion 602 includes an additive component having a PBG that generated an amine on exposure (see NH2). After a bake process such as a hard bake process, the amine reacts with the ALG component of the PR layer. This provides a covalent bond between a component of the middle layer and a component of photoresist as illustrated in FIG. 9. As illustrated the component of the middle layer is a component of the generated base (NH).

Figure 10:
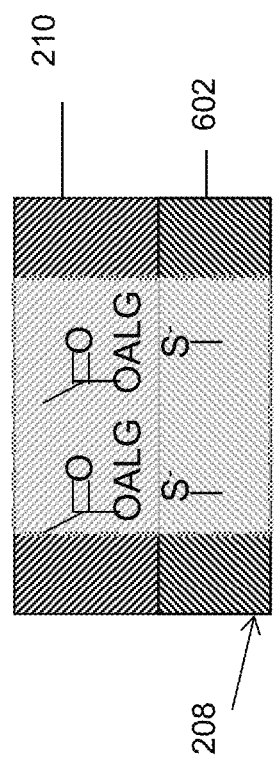
Figure 11:
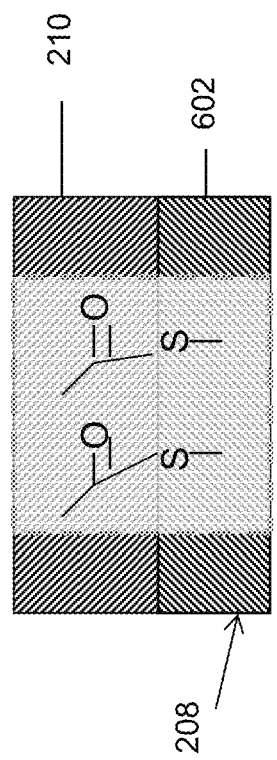

Another embodiment is illustrated in the example of FIG. 10, which also shows the upper portion 602 of a middle layer 208. The upper portion 602 includes an additive component having a PBG that generated a base of a sulfur ion S$^-$ or S$^{-2}$ on exposure (see S$^-$). The PR layer composition containing the acid labile group (ALG) in the photoresist 210. After a bake process such as a hard bake process, the S$^-$ reacts with the ALG component of the PR layer. This provides a covalent bond between a component of the middle layer and a component of photoresist with covalently bonds with a component of photoresist as illustrated in FIG. 11. As illustrated the component of the middle layer is the generated base (S$^-$).

Various advantages may be present in one or more embodiments of the methods, devices and compositions described herein. The present disclosure provides a new material for a middle layer in a trilayer patterning stack. Embodiments of these materials and methods using them, can improve photoresist pattern peeling by providing improved adhesion between layers of a stack. This can provide for more accurate patterning, sharper pattern resolutions, lowered rework or scrap rates, and/or other benefits. The improved adhesion is provided by generating a base component which can interact and/or bond with portions of the photoresist layer. The bond provided may be a covalent bond.

One of the broader forms of the present disclosure relates to a method of making a semiconductor device. The method includes forming a middle layer (ML) of a patterning stack (e.g., a tri-layer patterning stack such as a tri-layer resist) and forming a photoresist layer directly on the middle layer. The middle layer includes an additive component having a photo base generator (PBG). The substrate including the photoresist layer and the middle layer is then exposed to a radiation.

In a further embodiment, a covalent bond is formed between the ML and a component of the PR layer. The exposed PR layer having the covalent bond is then developed. An upper surface of the ML may contain a higher concentration of the additive component having the photo base generator than a lower region of the ML. In one example, the additive including the PBG floats to an upper surface of the ML.

In an embodiment, the PBG generates a base of an amine. The photoresist layer may include a composition of having a photo acid generator (PAG) added to the PR layer. After exposure, the base generated by the photo base generator may be used to quench an acid generated by the PAG. In a further embodiment, after using the base to quench the acid generated by the PAG, the PR layer and the ML are baked. A residual amount of base generated by the photo base generator (after the quenching) that has not reacted with the acid generated by the PAG is reacted with a component of the PR layer to form a covalent bond.

In another further embodiment, after exposing, the substrate including the ML and the PR layer is baked. During and/or after the baking, a covalent bond is formed between the ML and a component of the PR layer by reacting a base generated by the photo base generator with an acid labile group of the PR layer. This PR layer is then developed.

In an embodiment, the middle layer is formed by blending a second polymer having the photo base group with a siloxane polymer, chemically binding the additive component having photo base group to a siloxane polymer backbone, or both.

In one embodiment, the patterning stack further includes an underlying layer (under the middle layer). After exposure of the PR layer, the patterned PR layer may be used to etch the ML.

Another one of the broader forms of the present disclosure involves another method of making a semiconductor device. In the method, middle layer comprising a photo base generator is formed over a substrate. A photoresist layer is then formed over the middle layer. A radiation beam is provided incident the photoresist layer. The radiation beam generates an acid component in the photoresist layer and a base component in the middle layer. The substrate after providing the radiation beam is then baked. The base in the middle layer and the acid group in the photoresist layer to form a covalent bond between the middle layer and the photoresist layer.

In one embodiment, the acid component (e.g., generated by the PAG and/or exposure) is an acid labile group. The base component generated may be one of an amine and S⁻. In some embodiments, the covalent bond occurs only at an interface between an exposed region of the photoresist layer and the middle layer, while substantially not occurring in regions that were not exposed. In an embodiment, when forming the middle layer the additive component having the photo base generator floats to a region of the middle layer adjacent the photoresist layer.

The present disclosure also describes a material used in photolithography patterning. The material may be a material stack having an underlying, a middle layer, and a photoresist layer. The underlying layer may include an organic polymer. The middle layer may include a silicon-containing polymer and a photo base generator (attached to the silicon-containing polymer or provided on an additive component blended with the silicon containing polymer). The photoresist layer includes a photosensitive material.

In a further embodiment, the middle layer also includes an additive component mixed with the silicon-containing polymer. The photo base generator is attached to the additive component. The middle layer may include approximately 10% additive component. The photo base generator may generate at least one of an amine and an S— on exposure to radiation. In an embodiment, the photoresist is a positive tone resist soluble to a negative tone developer.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of making a semiconductor device, the method comprising:
    forming a middle layer (ML) comprising a photo base generator over a substrate, wherein the ML includes an additive component, the additive component including a photo base generator (PBG);
    forming a photoresist layer over the middle layer;
    providing a radiation beam incident the photoresist layer, wherein the radiation beam generates an acid component in the photoresist layer and a base component from the PBG in the middle layer;
    quenching the generated acid component in the photoresist layer with a first amount of the base component generated;
    baking the substrate after providing the radiation beam; and
    after initiating the baking, reacting a second amount of the base component generated in the middle layer wherein the reacting forms covalent bonds between the second amount of the base component in the middle layer and a component of the photoresist layer.

2. The method of claim 1, wherein the acid component is an acid labile group.

3. The method of claim 1, wherein the base component is one of an amine and a sulfur ion (S—).

4. The method of claim 1, wherein the covalent bond occurs only at the interface between an exposed region of the photoresist layer and the middle layer.

5. A method of making a semiconductor device, the method comprising:
    providing a semiconductor substrate;
    forming an underlying layer of a patterning stack on the semiconductor substrate, wherein the underlying layer includes an organic polymer;
    forming a middle layer (ML) of the patterning stack on the semiconductor substrate, wherein the middle layer includes an additive component having a photo base generator (PBG);
    forming a photoresist layer (PR) of the patterning stack directly on the middle layer; and exposing the semiconductor substrate to a radiation beam, wherein the exposing produces a sulfur ion (S—) from the PBG; and after initiating a baking process, covalently bonding the sulfur of the sulfur ion to a component of the PR.

6. The method of claim 5, wherein an upper surface of the ML contains a higher concentration of the additive component having the photo base generator than a lower region of the ML.

7. The method of claim 5, further comprising:

adding a photo acid generator (PAG) to the PR layer; and after exposure, using the base generated by the photo base generator to quench an acid generated by the PAG.

* * * * *